United States Patent [19]

Lamboley

[11] Patent Number: 4,518,867
[45] Date of Patent: May 21, 1985

[54] SELF-ADAPTING PROCESS AND DEVICE FOR TRIGGERING A TRIAC

[75] Inventor: Jean J. Lamboley, Paris, France

[73] Assignee: Thomson-CSF, Paris, France

[21] Appl. No.: 371,420

[22] Filed: Apr. 23, 1982

[30] Foreign Application Priority Data

Apr. 27, 1981 [FR] France ................................ 81 08336

[51] Int. Cl.³ ............................................ H03K 17/72
[52] U.S. Cl. ................................ 307/252 B; 323/239; 323/282
[58] Field of Search .......... 307/252 B, 252 N, 252 W; 323/217, 282, 283, 239

[56] References Cited

U.S. PATENT DOCUMENTS

| | | | |
|---|---|---|---|
| 3,728,557 | 4/1973 | Pelly et al. | 307/252 N |
| 3,763,395 | 10/1973 | Shilling et al. | 307/252 B |
| 3,793,537 | 2/1974 | Stringer | 307/252 N |
| 4,028,609 | 6/1977 | Detering | 307/252 N |
| 4,355,242 | 10/1982 | Lezan et al. | 307/252 B |

Primary Examiner—John Zazworsky
Attorney, Agent, or Firm—Cushman, Darby & Cushman

[57] ABSTRACT

With a triac placed in series with a load, a threshold detector feeds a modulator supplying a pulse with a given delay with respect to a change of condition of the threshold detector. The output of the modulator is fed through a gate and a monostable flip-flop to the gate electrode of the triac. After the first gate pulse, if the threshold detector detects another voltage rise at the terminals of the triac during a period of time determined by a second monostable flip-flop, this change of condition causes, through an AND gate, the OR gate and the first monostable flip-flop, another pulse to be supplied to the gate electrode of the triac. The result is an increase in the reliability of triggering a triac and reduction in the consumption of the control circuit.

3 Claims, 3 Drawing Figures

SELF-ADAPTING PROCESS AND DEVICE FOR TRIGGERING A TRIAC

BACKGROUND OF THE INVENTION

The present invention relates to a self-adapting process and device for triggering a triac according to an adjustable conduction angle.

A triac is a two-way conducting device which becomes conducting when a current of sufficient strength is applied to its gate electrode and which then remains conducting independently of the gate current from the moment when, and as long as, a current of a strength greater than a given threshold flows therethrough between its main electrodes.

Thus, in triac control circuits, possibly constructed in the form of integrated circuits, efforts are made to supply the gate electrode of a triac with a pulse of sufficient amplitude and duration to allow triggering thereof. Nevertheless, so as to avoid increasing the consumption of the control circuit, efforts are made to limit as much as possible said amplitude and said duration. Determination of the amplitude of the pulse to be applied is relatively simple and depends on the characteristics of the triac, more especially on the quadrants in which the control takes place, some quadrants being more sensitive than others. The choice of the duration of the control pulse is much more delicate for it depends on the characteristics of the load circuit in which the triac is inserted. In particular, if this load circuit has a relatively high self-induction, the time for establishing the current will be slow and it will be advisable to choose a pulse of considerable length, this length depending on the nature of the load circuit.

Thus, it is necessary, if it is desired to construct a triac control circuit able to operate with loads of different natures, to choose relatively high gate control pulse durations, the length of these pulses being superfluous in the case where the load has low or no self-induction. The result is an unnecessarily high energy consumption for the gate control circuit in this latter case.

Thus, an object of the present invention is to provide a process and a device for triggering a triac allowing low energy dissipation in the control circuit.

In the present invention, we will be more particularly interested in the conduction angle control for triggering a triac fed with a periodic current, for example at 50 Hz.

It is then a question of supplying a first pulse to the triac after a time depending on the chosen conduction angle, then in repeating successive pulses if the first pulse was not sufficient to produce triggering. A difficulty arises in that at the end of the conducting period, the triac shuts off, the result is a rise in voltage at the terminals of the triac and this voltage rise must not be interpreted as a triggering failure for this would lead to supplying one or more pulses at the beginning of a half-wave and so in effecting a "full angle" control.

SUMMARY OF THE INVENTION

With these objects in view, the present invention provides a self-adapting process and device for triggering a triac. This process comprises the steps which consist in: supplying a first short gate pulse to the triac at the moment when it is desired to trigger same; detecting the possible non triggering of the triac at the end of the gate pulse; supplying another gate pulse to the triac if the detection has revealed non triggering; and repeating these operations until triggering is obtained. Detection of triggering is preferably provided by detecting the voltage at the terminals of the triac in the absence of the gate pulse. The maximum time interval between two short gate pulses, i.e. the period of time during which detection of possible non triggering is carried out, is sufficiently short for the current in the load not to undergo an appreciable decrease during this interval.

A self-adapting device for triggering a triac in series with an electronic load comprises: a circuit for detecting when the voltage at the terminals of the triac has exceeded a given threshold, this circuit supplying a high level signal when and as long as this threshold is exceeded; an adjustable modulating circuit receiving the signal from the detector and supplying a first gate pulse of short duration at the end of a set time after the signal of the detector has passed from the low to the high level. The modulating circuit can only supply the first gate pulse if the signal from the detector remains at the high level for the whole duration of the set time. This device further comprises means for supplying other short gate pulses to the triac if the signal of the detector passes again from the low to the high level during a time interval following the application of each short pulse, this time interval having a sufficiently short duration so that the current in the load does not appreciably decrease during its flow. Thus, depending on the nature of the load, a greater or smaller number of gate pulses will be supplied for controlling the triac, this number of pulses being strictly limited to the number required.

BRIEF DESCRIPTION OF THE DRAWINGS

These objects, features and advantages, and others, of the present invention will be discussed in greater detail in the following description of particular embodiments made with reference to the accompanying figures in which.

DESCRIPTION OF THE PREFERRED EMBODIMENTS

Figure 1:
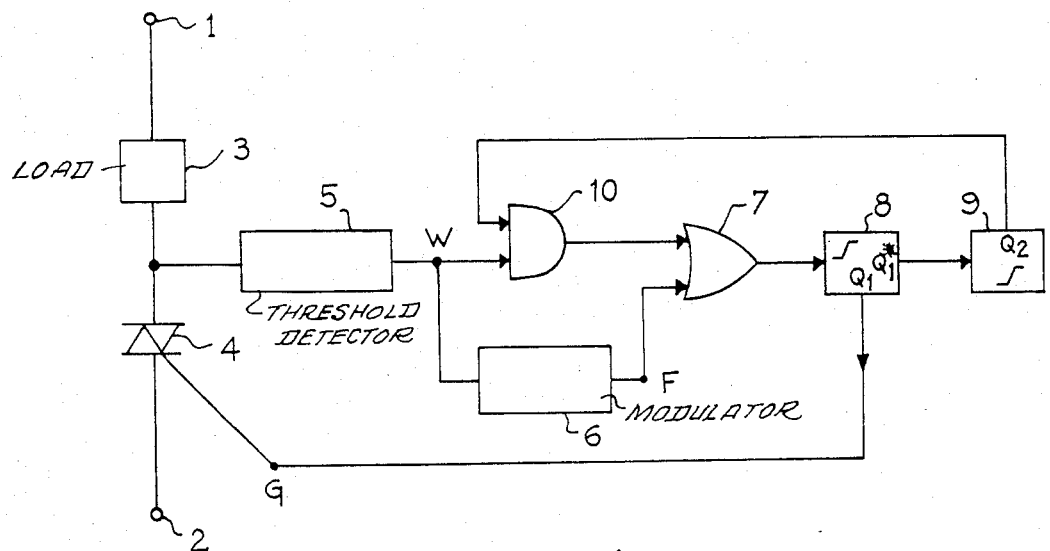
FIGS. 1 and 3 show embodiments of the present invention.

FIG. 1 shows schematically and in block form one embodiment of the present invention. A supply voltage is supplied between terminals 1 and 2 between which are connected in series a load 3 and a triac 4.

At the terminals of triac 4 is disposed a threshold detector 5. This threshold detector is a circuit which supplies a high level pulse W when the voltage of the triac is greater than a given threshold and a low level pulse when this voltage is less than the threshold. The output of threshold detector 5 is fed to a modulator 6 supplying a pulse output signal F. A pulse F is supplied, after a given delay after transition from a low to high level of signal W provided that transition from a high to a low level of this signal W has not occurred within a given time interval. Signal F is fed through an OR gate 7 to a monostable flip-flop 8. The output $Q_1$ of this monostable flip-flop supplies a signal of constant set duration following reception of a rising front. This output $Q_1$ is connected to the gate terminal G of triac 4. The complementary output $Q_1^*$ of flip-flop 8 is connected to a second monostable flip-flop 9 also triggerable by rising voltage fronts. The output $Q_2$ of this monostable flip-flop 9 is connected to the second input of an AND gate 10 whose first input receives the output signal W of threshold detector 5 and whose output is connected to a second input of the OR gate 7.

Figure 2:
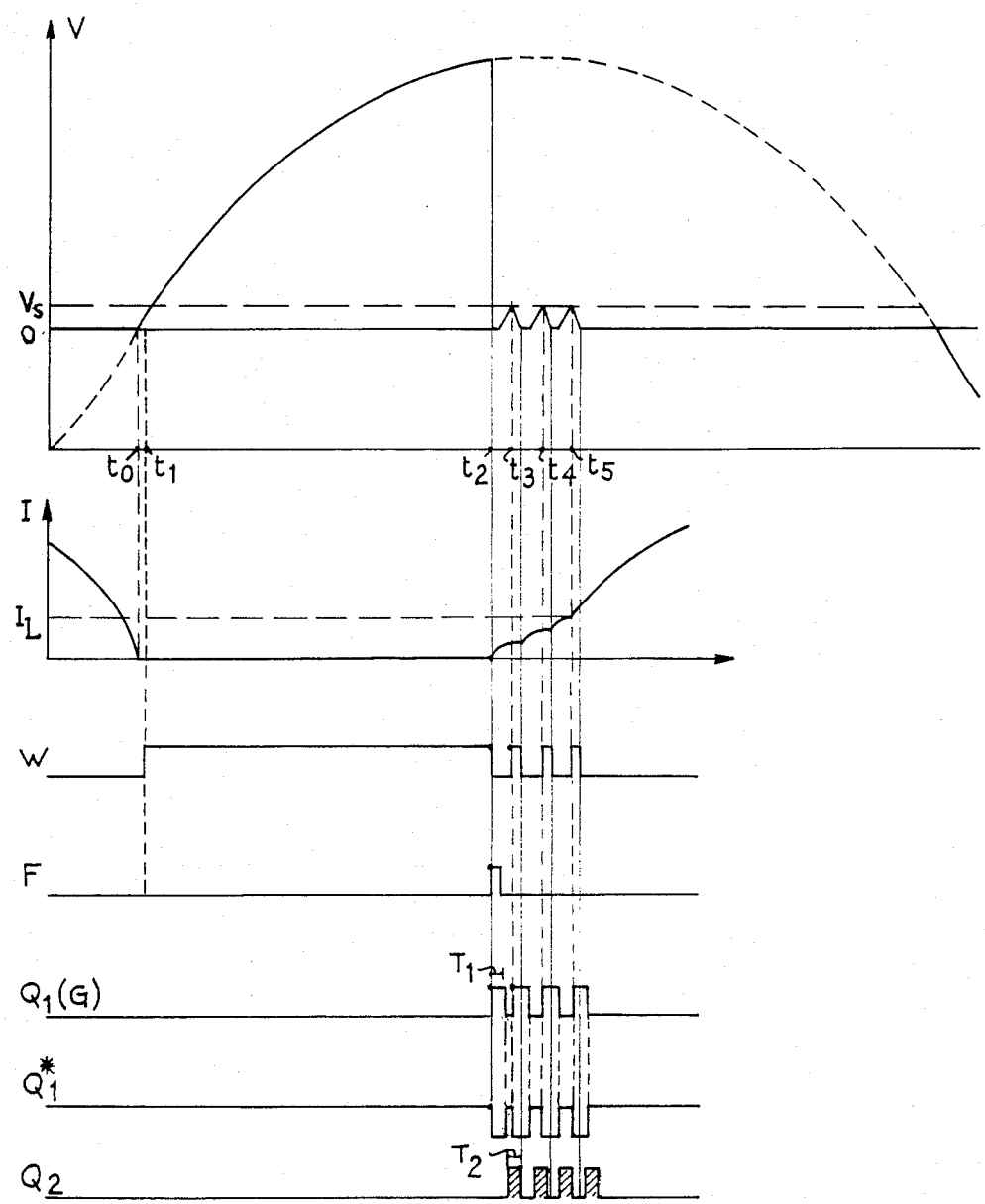
FIG. 2 shows voltage diagrams for illustrating the operation of the circuit of FIG. 1.

The operation of this circuit will now be discussed with reference to FIG. 2 which shows different voltage and current waveforms as a function of time at different points in the circuit of FIG. 1. FIG. 2 more particularly shows the voltage V at the terminals of the triac, the current I in the load circuit, the signal W at the output of threshold detector 5, the signal F at the output of modulator 6, output signals $Q_1$ and $Q_1^*$ from the monostable flip-flop 8 and the output signal $Q_2$ from the monostable flip-flop 9. In the FIG. 2, it should be noted that no scale has been set forth with regard to the strengths of the different signals, within a given curve, with regard to the relative widths of the different signals or pulses, the width of the triggering pulses being on the order of a microsecond or about ten microseconds, whereas the width of a half wave of the current conducting terminals is ten milliseconds if this voltage has a frequency of 50 Hz.

It is assumed that the triac is initially in a conducting condition. At time $t_0$, the voltage of the current conducting terminal becomes zero and passes from a positive half-wave to a negative half-wave. Then, in the absence of a gate signal, the triac passes to a non conducting condition as soon as the current in the load becomes zero. At time $t_1$, the voltage V at the terminals of this triac reaches a threshold value $V_S$ and signal W passes from a low to a high level. The threshold voltage $V_S$ may be chosen at a value on the order of ten volts. It is important for this value to be as low as possible and yet allow proper detection, taking into account the residual voltage at the terminals of the triac and the ambient electrical noises. Modulator 6 detects this rise of signal W and supplies at time $t_2$, after a preset time interval which depends on the chosen conduction angle, a short pulse F. The triac is then caused to conduct and signal W passes to a low level. Pulse F is shaped by the monostable flip-flop 8 and the gate signal $Q_1$ is supplied, possibly through an amplifier, to the gate G of triac 4 for a period of time $T_1$. The output $Q_1^*$ of monostable circuit 8 is fed to the monostable circuit 9 which triggers on the rising front of this signal (corresponding to the falling front of signal $Q_1$). This monostable flip-flop 9 then supplies for a period of time $T_2$ an enabling signal to AND gate 10. If, during this period of time, no change occurs in the condition of signal W, signals $Q_1$ and $Q_2$ both remain at a low level until the time $t_2$ of the next halfwave of the voltage of the current conducting terminals. One of the essential roles of the inhibition, by signal $Q_2$, of AND gate 10 is to prevent the rise of signal W occurring at time $t_0$ from causing a change in the condition of signal $Q_1$, which would be the case if signal W were applied directly to the OR gate 7 without the enabling operating provided by AND gate 10.

Assuming, as indicated in FIG. 2, that the triggering of the triac does not occur appropriately and that, after fall off of the gate pulse supplied by signal $Q_1$, the triac triggers as soon as the voltage at its terminals increases to again exceed voltage $V_S$ during the time interval $T_2$, there occurs at time $t_3$ a rise of signal W and, consequently, a rise of signal $Q_1$. In the figures, it has been assumed that this procedure must be repeated three times at times $t_3$, $t_4$ and $t_5$ and that it is only after the fourth gate pulse that the triac is effectively triggered. An explanation of this need to produce multiple pulses in certain particular cases may be seen with reference to the curve indicating the variations of current I in the triac. If, after the first gate pulse, the current I has not reached a value $I_L$ usually designated by the expression "holding current", the triac does not trigger. The next gate pulse should be applied very rapidly so that the current does not have time to decrease sufficiently before application of the next gate pulse. Thus, during each successive gate pulse, the value of the current in the triac increases. This is one of the reasons why as low a value as possible for the threshold detection voltage $V_S$ should be chosen, as was pointed out above. For example, the voltage $V_S$ should be chosen on the order of approximately 10 volts and the durations $T_1$ and $T_2$ of pulses $Q_1$ and $Q_2$ may be of the same value, for example 20 microseconds. Of course, this value depends essentially on the nature of the most self-inductive circuit to which the triggering device of the invention is likely to be connected.

Figure 3:
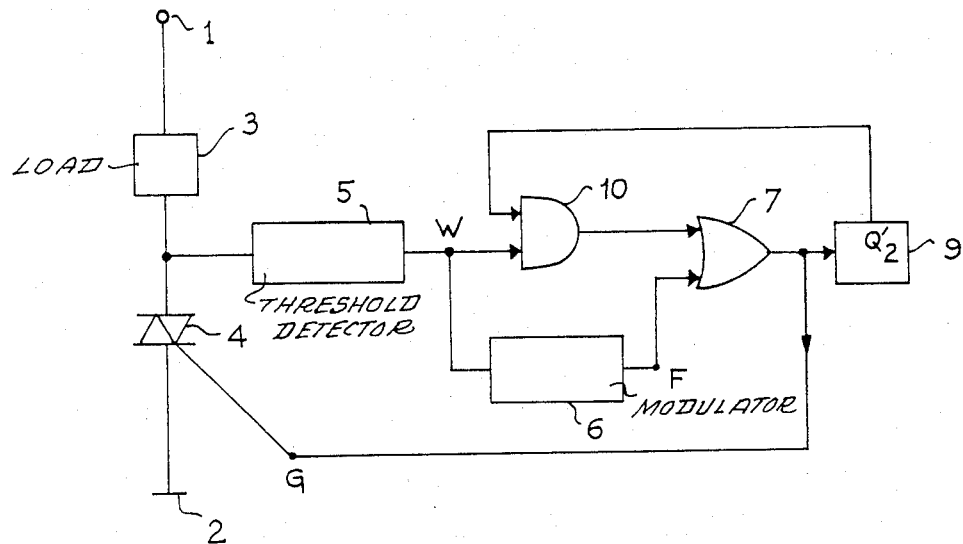

A variation of the circuit of the invention is illustrated in FIG. 3. In this variation, the first monostable circuit 8 is omitted and the output pulses from OR gate 7 are applied directly to the gate of the triac (possibly through an amplifying circuit). The second monostable flip-flop 9 which triggers on the rising front or on the falling front of the output pulses of OR gate 7 enables AND gate 10 only for a short time interval after each gate pulse. In this embodiment, advantage is taken of the inherent duration of the minimum pulse supplied at the output of the OR gate and related to the time of propagation of information through the threshold detector, the AND gate, the OR gate and the triac.

The circuit of the present invention is susceptible of variations as long as the two main features are retained, namely, that the signal of the threshold detector is fed to the gate of a triac, on the one hand, a certain time after each zero crossover through a modulator and, on the other hand, after a first pulse if, and only if, shut-off occurs during a given period of time after each pulse.

In the preceding description, the different blocks designated as threshold detectors and modulators have not been shown in the form of detailed circuits since the construction of such circuits is within the scope of one skilled in the art, given the function of these circuits, which was defined above. It will be noted that one of the important aspects of the present invention is that the circuits described lend themselves more particularly to construction in the form of integrated circuits. More especially, the modulator may be of the digital or non-analog type.

The present invention is not limited to the embodiments which have been explicitly described, it comprises, on the contrary, the different variations and generalizations thereof included within the scope of the following claims.

What is claimed is:

1. A triac triggering circuit for use with a triac having two terminals and a gate, and an electric load such that the current in the electric load will progressively decrease when the triac is turned off, said triggering circuit being used for controlling the triac and comprising:
   a threshold circuit for outputting a threshold signal indicating that the voltage across the terminals of the triac exceeds a predetermined threshold level;
   an adjustable modulating circuit for receiving the threshold signal from said threshold circuit and for supplying to the gate of the triac a first gate pulse of short duration at the end of an adjustable time after issuance of said threshold signal, said first gate pulse being issued only if said threshold signal has not been interrupted during said adjustable time;

means for supplying successive gate pulses of short duration to the gate of the triac; and a monostable flip-flop actuated by said first and successive gate pulses for outputting an output signal after each gate pulse, wherein said means for supplying successive gate pulses has inputs connected to the output of said monostable flip-flop, to the output of said threshold circuit, and to said modulating circuit, and having an output supplying a successive gate pulse whenever said threshold signal is issued outside said adjustable time during said output signal, and said output signal having a short duration such that the current in the load will not decrease in a significant way during this duration in case of triggering failure of the triac.

2. A triac triggering circuit as claimed in claim 1, said means for supplying successive gate pulses comprising:
    a two input AND-gate receiving the threshold signal and the output signal; and
    an OR-gate receiving an output of the AND-gate and an output of the modulating circuit, and providing an output to the monostable flip-flop and to the gate of the triac.

3. A triac triggering circuit as claimed in claim 1, said means for supplying successive gate pulses comprising:
    a two input AND-gate receiving the threshold signal and the output signal;
    an OR-gate receiving an output of the AND-gate and an output of the modulating circuit; and
    an additional monostable flip-flop receiving the output of said OR-gate and having a first output connected to the gate of the triac and a second output connected to the first monostable flip-flop.

* * * * *